US008222052B2

(12) United States Patent
Svensson et al.

(10) Patent No.: US 8,222,052 B2
(45) Date of Patent: Jul. 17, 2012

(54) METHOD FOR GROWTH OF DILUTE-NITRIDE MATERIALS USING AN ISOTOPE FOR ENHANCING THE SENSITIVITY OF RESONANT NUCLEAR REATION ANALYSIS

(75) Inventors: Stefan P. Svensson, Columbia, MD (US); John D. Demaree, Baltimore, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 310 days.

(21) Appl. No.: 12/628,675

(22) Filed: Dec. 1, 2009

(65) Prior Publication Data

US 2011/0129949 A1   Jun. 2, 2011

(51) Int. Cl.
*G01R 31/26* (2006.01)
*H01L 21/66* (2006.01)

(52) U.S. Cl. .................. 438/14; 438/16; 257/E21.11
(58) Field of Classification Search .................. None
See application file for complete search history.

(56) References Cited

U.S. PATENT DOCUMENTS

| | | | |
|---|---|---|---|
| 3,915,765 A * | 10/1975 | Cho et al. ............. | 438/379 |
| 5,903,017 A | 5/1999 | Itaya et al. | |
| 6,073,578 A * | 6/2000 | Shim et al. ............ | 118/723 I |
| 6,147,364 A | 11/2000 | Itaya et al. | |
| 6,887,727 B2 | 5/2005 | Takeuchi et al. | |
| 7,154,128 B2 | 12/2006 | Kiyoku et al. | |
| 7,795,120 B1 * | 9/2010 | Price et al. ........... | 438/512 |

OTHER PUBLICATIONS

Predetermined. (n.d.) The American Heritage® Dictionary of the English Language, Fourth Edition. (2003). Retrieved Dec. 30, 2011 from http://www.thefreedictionary.com/predetermined.*
Novikov, S.V. et al. in "MBE growth of GaN using 15N isotope for nuclear magnetic resonance applications", 2007, Journal of Crystal Growth, 301-302, pp. 417-419.*
Alt, H. Ch. et al. in "Local vibrational mode absorption of nitrogen in GaAsN and InGaAsN layers grown by molecular beam epitaxy", 2001, Physica B, 302-303, pp. 282-290.*
Ding, X. et al. in "High enrichment of 15N by chromatographic chemical process", Jun. 22, 2008, Journal of Chromatography A, 1201, pp. 65-68.*
Zhang et al. in "Scaling of band-gap reduction in heavily nitrogen doped GaAs", 2001, Physical Review B. vol. 63, 161303(R).*
R.C. Reedy et al., "Analysis of Nitrogen Incorporation in Group III-Nitride-Arsenide Materials Using a Magnetic Sector Secondary-Ion Mass Spectrometry (SIMS) Instrument," National Renewable Energy Laboratory/CP-520-31005 (Oct. 2001) (preprint).

* cited by examiner

*Primary Examiner* — Nathan Ha
*Assistant Examiner* — Michael Jung
(74) *Attorney, Agent, or Firm* — Christos S. Kyriakou; John H. Raubitschek

(57) ABSTRACT

In certain desirable embodiments, the present invention relates to the use of $^{15}N$ isotopes into GaAsN, InAsN or GaSbN films for ion beam analysis. A semiconductor-nitride assembly for growing and analyzing crystal growth in a group III-V semiconductor sample that includes: a substrate; a buffer layer deposited on the substrate, a nitrogen gas injector to incorporate enriched nitrogen gas and the nitrogen gas injector includes a concentration of enriched nitrogen gas, a thin film consisting of at least one group III element containing compound where at least one group III element is covalently bonded with the nitrogen in the presence of the same or different group V element of the buffer layer, and a proton beam to analyze the incorporation of the nitrogen gas in the thin film layer is described.

8 Claims, 3 Drawing Sheets

METHOD FOR GROWTH OF DILUTE-NITRIDE MATERIALS USING AN ISOTOPE FOR ENHANCING THE SENSITIVITY OF RESONANT NUCLEAR REATION ANALYSIS

GOVERNMENT INTEREST

The embodiments described herein may be manufactured, used, and/or licensed by or for the United States Government without the payment of royalties thereon.

BACKGROUND

1. Technical Field

The embodiments described herein generally relate to methods, tests, and devices for analyzing the concentration and crystalline lattice location of amounts of nitrogen in semiconductor materials.

2. Description of the Related Art

Generally, the military's and more specifically, the Army's overwhelming need for enhanced night-vision monitoring/detection tools is well known within the military community as well as those skilled in the art. Consequently, in order to efficiently meet this need, infrared (IR) detector materials having high detectivity and low manufacturing costs associated therewith are desirable. Currently, Mercury Cadmium Telluride (MCT) or HgCdTe (also referred to cadmium mercury telluride) is the material technology of choice utilized for its adaptability and high performance. In particular, MCT is an alloy made of Cadmium Telluride (CdTe) and Mercury Telluride (HgTe) wherein the amount of Cd in the alloy composition can be chosen so as to tweak or tune the optical absorption of the material to the desired wavelength. Thus, MCT is adaptable to achieve an end-user specified desired optical absorption. Further, MCT is known as being the only material having the ability to detect IR radiation in both of the accessible atmospheric windows, i.e., the mid-wave infrared window (MWIR), which ranges from 3 to 5 μm and the long-wave window (LWIR), which ranges from 10-12 μm. However, MCT is a Group II-VI material that has limited use with regard to other applications and, furthermore, can only be processed in dedicated fabrication facilities. As such, the use of MCT can be very costly.

In contrast, Group III-V materials have many commercial and military applications. Thus, an IR material technology that utilizes and builds upon the existing industrial III-V infrastructure could realize significant cost savings.

In particular, it has been determined that by combining nitrogen with the group V element(s) in a III-V semiconductor with group III elements like Ga, In and Al, materials with relatively large bandgaps can be formed. In recent years it has been realized that addition of small amounts (<10%) of nitrogen to other III-V compounds has the effect of strongly reducing the bandgap. This effect has been used to develop materials in which bandgaps can be tailored and yet are still lattice-matched to available substrates. These compounds are commonly called "dilute-nitrides"—referring to the relatively small concentration of nitrogen. Specifically, the effect has been used to develop materials with bandgaps that allow light absorption and emission at 1.6 micron—the wavelength of maximum transmission of fiber optic cables. These materials use alloys of (Al, Ga, In) (As, Sb, N) which can be lattice matched to GaAs. More recently it has been proposed that the bandgap-narrowing effect can be used in materials with even smaller bandgaps, targeting detectors for the long and very-long infrared range. (These materials would typically use GaSb-, InAs-, or InSb-substrates.) These materials would provide a lower-cost, high-performance, III-V-based alternative to current II-VI materials. Dilute nitrides are therefore expected to have a significant technological impact on both the commercial and military electronic and electro-optics markets.

Materials synthesis techniques for dilute-nitrides are in their infancy and much work remains to be done to optimize the materials quality. One significant issue is control of the incorporation of nitrogen such that all of the nitrogen enters the crystal at substitutional group V sites. There is some evidence that a significant amount of the incorporated nitrogen resides in interstitial sites, forming unwanted electrically and optically-active centers. Some of this evidence comes from ion beam analysis experiments using resonant nuclear reaction analysis (RNRA). For example the reaction:

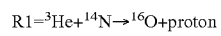

$R1 = {}^3He + {}^{14}N \rightarrow {}^{16}O + proton$ has been used. Unfortunately, the probability of ion-atom interaction, i.e., the reaction cross section for this reaction is extremely small, making measurements time consuming. Additionally, this method requires the use of a $^3$He ion beam, which can contaminate beamline components and lead to unwanted background reactions in future experiments.

To overcome these shortcomings the state of the art, molecular beam epitaxy (MBE) systems and methods provide for, among other things, the combination of a novel way of synthesizing dilute-nitrides together with an optimum RNRA reaction method that will maximize the sensitivity of the analysis method. It has been realized that the sensitivity improvement will be more than two orders of magnitude over previously used methods.

In the certain desirable embodiments described herein, dilute-nitride films are grown using MBE. The films may be grown on any available substrate and can target any desired wavelength. In the common MBE process, nitrogen is introduced to the growth reactor as a gas and can be excited in a plasma source to produce chemically reactive nitrogen that can be incorporated in the film. Previously all such work has used common nitrogen gas, which is a mixture of $^{14}$N and the isotope $^{15}$N. The natural abundance of $^{15}$N is 0.366% with the remaining 99.96% being $^{14}$N. Thus, a reaction targeting $^{15}$N as an indicator of the total amount of nitrogen would have limited sensitivity. $^{15}$N has been used with success for analysis of nitrogen incorporation at the percent level in gun barrel steel. Conversely, in the embodiments disclosed herein, the films are grown using a supply of nitrogen gas enriched with the $^{15}$N isotope. $^{15}$N is available in concentrations approaching 100% thus giving rise to a sensitivity enhancement of a factor of 272 (=99.96/0.366) compared to the case when nitrogen with the natural abundance is used. An additional advantage with the method is that semiconductors, grown almost entirely with $^{15}$N, and that are exposed to protons of a specific energy that cause the selected nuclear reaction to occur, such material can be p-doped by the carbon atoms created by the process.

SUMMARY

In view of the foregoing, an embodiment herein provides a semiconductor-nitride assembly for growing and analyzing crystal growth in a group III-V semiconductor sample comprising a substrate; a buffer layer deposited on the substrate; a nitrogen gas injector to incorporate enriched nitrogen gas, wherein the nitrogen gas injector may include a concentration of enriched nitrogen gas having a concentration greater than naturally occurs, more desirably greater than about 50 weight percent, still more desirably greater than about 60%, 70%, 80%, 90% 95%, 98% 99%, 99.5% and up to about 100% percent by weight or volume; a thin film consisting of the nitrogen and group III-V compounds; and an energetic proton beam to analyze the incorporation of the nitrogen gas in the thin film layer.

Such an embodiment may further include a cap-layer comprising any one of GaAs, InAs and GaSb deposited on said thin film layer.

Moreover, in such an embodiment thin film may comprise any one of GaAsN, InAsN, GaSbN, GaAs$^{15}$N, InAs$^{15}$N and GaSb$^{15}$N.

Additionally, the semiconductor substrate may comprise alloys mainly consisting of Al, Ga, In, P, As, and Sb. Further, the nitrogen gas may comprise any one of a nitrogen enriched isotope $^{15}$N and natural nitrogen gas $^{14}$N.

In addition, the thin film layer may be formed via molecular beam epitaxy.

The nitrogen injector also include a plasma unit comprising an RF power source; and a plasma supply source, wherein the plasma source may generate a plasma and the RF power source may supply RF power to irradiate the plasma to thereby generate a plasma that produces single nitrogen atoms to incorporate in the thin film layer.

Further, the proton beam may analyze the incorporation of nitrogen using the reaction:

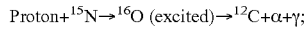

Proton+$^{15}$N→$^{16}$O (excited)→$^{12}$C+α+γ;

wherein the reaction takes place when the Proton reaches a predetermined resonant energy to preferentially form the $^{16}$O nucleus.

Still further, the reaction may convert a predetermined concentration of nitrogen atoms to acceptors, namely carbon atoms.

Moreover, an embodiment herein provides a method for analyzing crystal growth in a group III-V semiconductor comprising growing a group III-V substrate; depositing a group III-V buffer layer on said substrate; injecting a nitrogen gas via a nitrogen gas injector having a concentration of enriched nitrogen gas having a concentration of about 100% and further includes a plasma unit to generate a plasma; forming a thin film layer consisting of said nitrogen and group III-V compounds on said buffer layer; and analyzing the incorporation of said nitrogen gas in said thin film layer.

In addition, the thin film layer may comprise any one of GaAsN, GaAs$^{15}$N, GaSbN, and GaSb$^{15}$N.

Further, the injecting a nitrogen gas may further include irradiating the plasma with an RF power source to produce a plasma having single nitrogen atoms.

Still further, the method may include forming a cap-layer on the thin film layer comprising any one of GaAs and GaSb compounds. Additionally, the analyzing the incorporation of nitrogen may further include recording an x-ray diffraction rocking curve; and confirming the incorporation of nitrogen via the reaction:

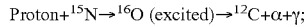

Proton+$^{15}$N→$^{16}$O (excited)→$^{12}$C+α+γ;

Moreover, the confirming the incorporation of said nitrogen may further comprises: converting a predetermined concentration of nitrogen atoms to acceptors, namely carbon atoms.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments described herein provide methods, tests and devices that include semiconductor nitride materials having amounts of nitrogen deliberately incorporated therein. More particularly, the embodiments described herein provide a process and device for analyzing the concentration and crystalline lattice location of small amounts of nitrogen, specifically $^{15}$N, deliberately incorporated in compound semiconductor materials.

Figure 1:
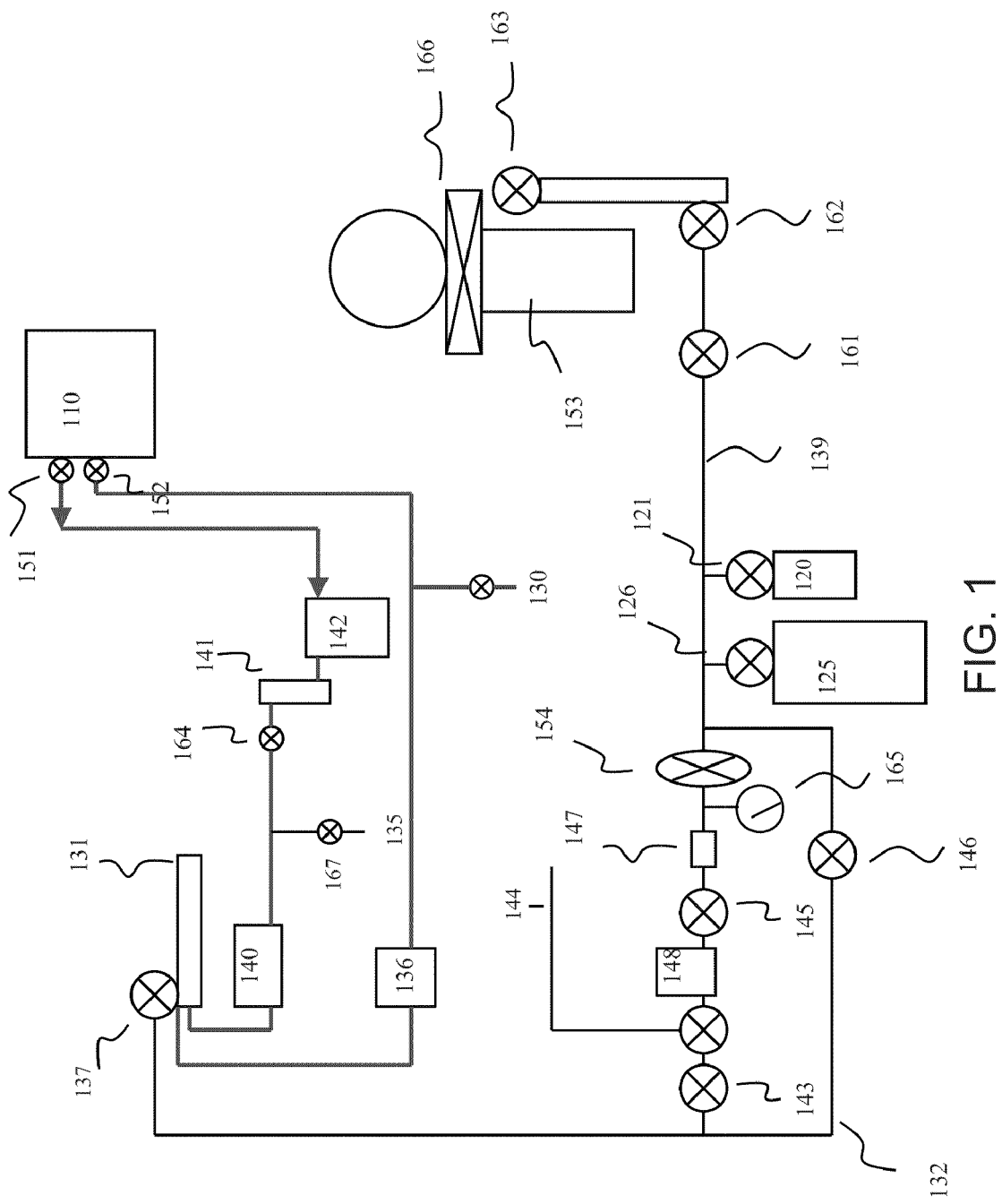
FIG. 1 illustrates a schematic diagram of the gas supply system of the MBE system according to embodiments herein.
Figure 2:
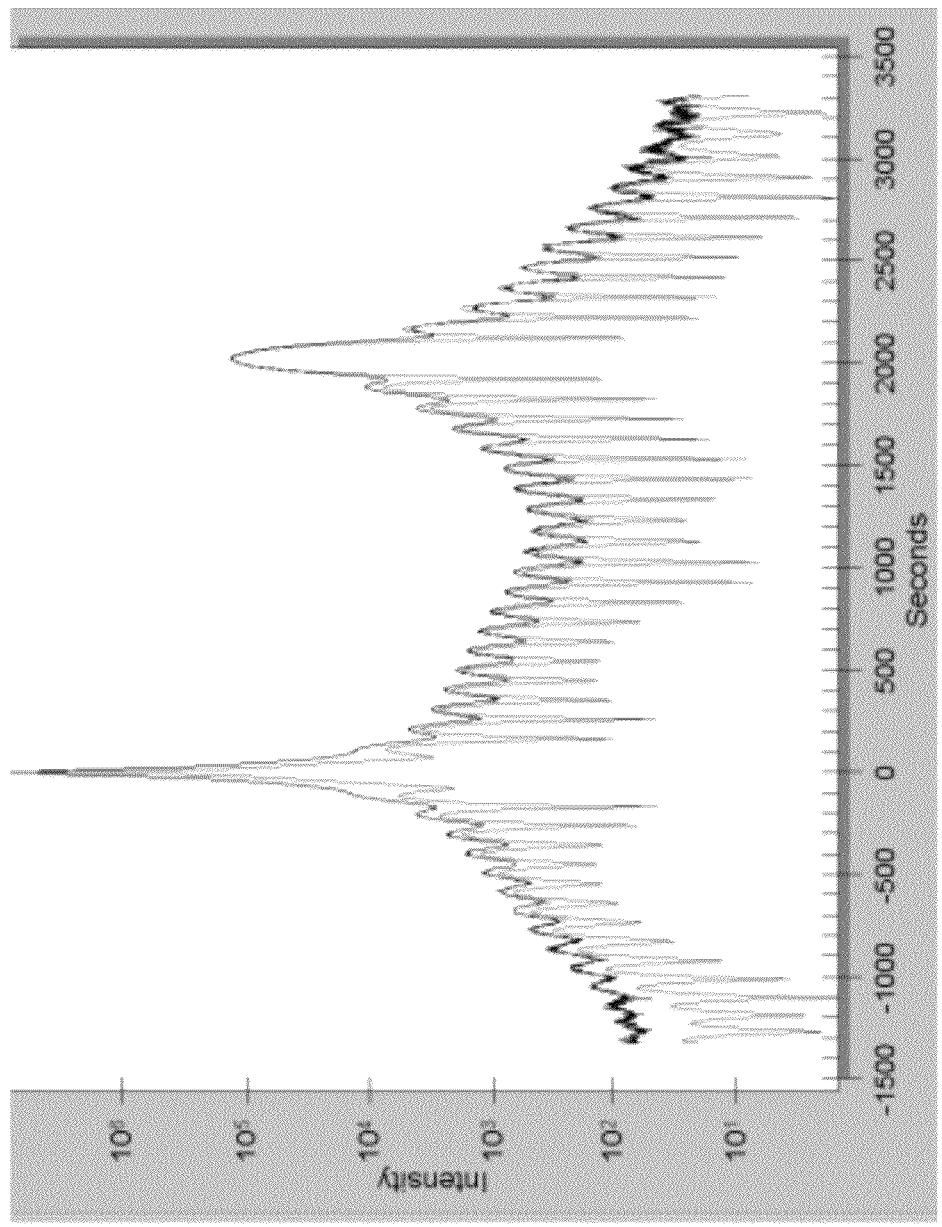
FIG. 2 illustrates an x-ray diffraction rocking curve verifying the successful incorporation of nitrogen of the gas supply system of FIG. 1, according to an embodiment herein.
Figure 3:
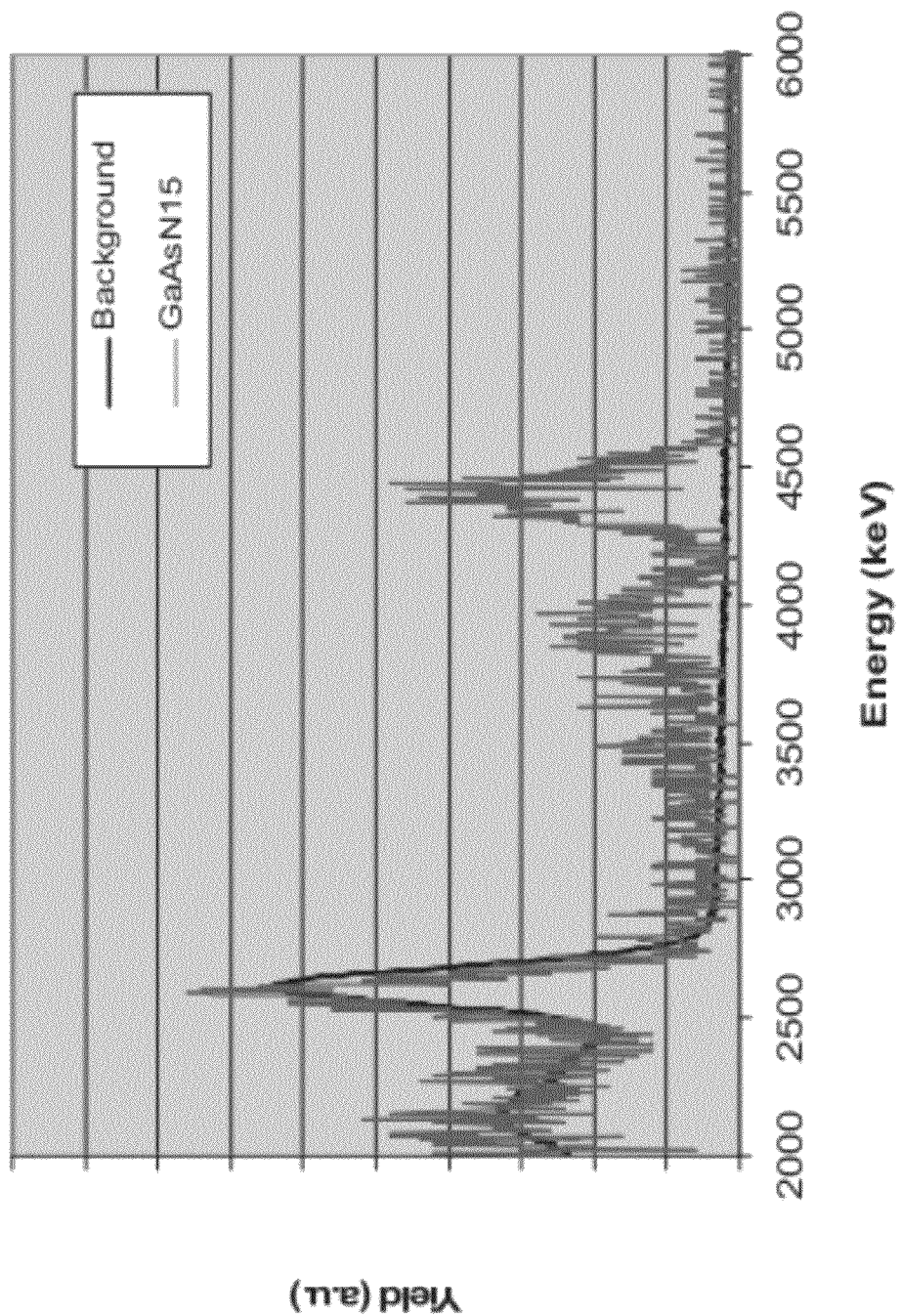
FIG. 3 illustrates a graph of the presence of nitrogen measured by RNRA, according to an embodiment herein.

Referring now to the drawings, and more particularly to FIGS. 1 through 3, where similar reference characters denote corresponding features consistently throughout the figures, there are shown preferred embodiments.

FIG. 1 is an illustration of a gas supply system for a state of the art molecular beam epitaxy (MBE) system according to an embodiment of the present invention. Generally, the system is comprised of water lines represented by the heavier, arrowed lines and gas lines which are represented by the lighter, thin lines. Further, the system is equipped with a nitrogen plasma source, which includes a nitrogen injector 131, a tuning network 140 and an Radio Frequency (RF) source (not shown) that can form a plasma that is capable of producing energetic, single, nitrogen atoms. It should be appreciated by those of ordinary skill in the art that nitrogen is typically found in its molecular N$_2$ state, as opposed to the single N atoms produced by plasma unit. The injector 131 is fed gaseous nitrogen, flowing through gas delivery line 139, from one of two pressurized bottles 125, 120, each bottle containing natural gas $^{14}$N and enriched $^{15}$N, respectively. The two pressurized bottles 125 and 120 connect to gas line 139 via their respective mechanical valves 126 and 121.

Furthermore, gas line 139 contains a regulator 154 that generally functions to reduce any residual gas pressure build up in gas delivery line 139. A filter 147 is disposed on gas delivery line 139 for reducing unwanted particulates from the gas stream generated through gas line 139. Additionally, a mass flow controller (MFC) 148 is disposed on gas line 139 for controlling the flow of nitrogen gas to the injector 131. Moreover, pressure gauge 165 indicates the nitrogen pressure at the MFC inlet. It is to be appreciated by those of ordinary skill in the art that the MFC 148 may either be analog or digital, depending upon the specifications of the end user. A plurality of valves 130, 137, 151, 152, 164 and 167 are located on the water lines and at various positions throughout the gas supply system to allow gas line 139 to remain pressurized in the event that components malfunction and/or need replacement. Some of these valves also control cooling water flow. Further water flow indicator 141 identifies the proper water cooling capacity and flow controller 142 ensures that the water lines remain at the proper cooling capacity. Water filter 136 is responsible for removing sediments from the water line. Bypass line 132 connects to gas line 139 and is generally utilized to evacuate the gas line 139. This is connected to the evacuation line for evacuation of the entire system and is serviced by a turbo-molecular pump 153. Turbo molecular pump 153 includes a gate valve 166 responsible for isolating the pump from the entire vacuum system (not shown) of the MBE system.

In the above described configuration, an example with a GaAs sample substrate, for example a wafer (not shown), is used as a sample being an object semiconductor for forming GaAs$^{15}$N will be described in detail below. The example cited below is merely for purposes of illustration and, as such, the embodiments herein are not limited to the specific example below. Further, it is to be appreciated that the substrate may be made of various suitable compounds including, but not limited to, GaAs, GaP, InAs, and InP.

Turning to FIG. 1, the growth process generally begins with placing a sample wafer or another semiconductor substrate in a growth chamber/reactor (not shown) and further desorbing oxide from the GaAs sample surface. In particular, the oxide desorption is done by thermally heating the sample in an Arsenide (As) flux to a specific temperature well known in the art (e.g., from about 580° C. to about 650° C.) at which a regular reflection high-energy electron diffraction (RHEED) pattern may be observed. In particular, a RHEED gun emits electrons which strike the surface of the substrate at a specified angle. Electrons reflect from the surface and strike a phosphor screen forming a pattern (i.e., the RHEED pattern). The RHEED pattern provides qualitative feedback with regard to the growth and surface of the substrate. The temperature of the growth reactor is then lowered to a value that is suitable for growth of GaAs (e.g., temperatures from about 400° C. to about 500° C.).

Typically, vapors of at least one Group III element compound are flowed into the growth chamber (not show) for initiating growth of the III-V buffer layer in the presence of the same or different Group V element gas or vapor. However, such buffer layers are not essential. Thus, referencing the above example, a buffer layer of GaAs is generally deposited on the sample wafer in order to produce a material that is cleaner and having a smoother surface than that of the raw substrate/wafer. It is well known that buffer layers provide a clean surface (although not required) which is an important prerequisite for epitaxial growth, since contaminants from the atmosphere or other sources can easily contaminate a clean wafer thereby causing crystal defects. The thickness of the buffer layer surface is not limited to a specific value and may be driven by end-user specifications.

The buffer layer growth is followed by the growth of a dilute nitride layer by flowing vapors in the form of "molecular beams" via individual element shutters, each including at least one Group III compound and vapors of a Group III element containing compound whereby at least one Group III element is covalently bonded with Nitrogen (N) in the presence of the same or different group V element gas or vapor as in the previous step, into the growth chamber (not shown). The temperature of the substrate described herein is further lowered to a value or range that is suitable and well known for growth of GaAs$^{15}$N (e.g., about 450° C.). At the above mentioned temperature range, the surface of the substrate need not be supplied with excess Arsenic (As) and thus, the sample can be turned away from the direction in which the element shutters (not shown) and more specifically, molecular beams (not shown) of MBE system are generally incident. The above step helps to protect the sample from unwanted exposure to irradiated, excited nitrogen once the plasma unit 131 is activated.

Gas line 139 is pressurized with either $^{14}$N or $^{15}$N from either pressurized bottle 125 or 120. However, prior to the gas pressurization, all gas valves (137, 143, 145, 146, 161, 162 and 163) and the MFC 148 are closed. Regulator 154 is set to an appropriate value (e.g. 10 psi) that will enable easy flow of gas from the pressurized bottle(s) 125 and/or 120 utilized, through gas line 139. The valve 137 is then opened, thereby connecting the injector 131, e.g. a plasma unit, with the gas line 139. If gas line 139 has been properly evacuated via bypass line 132, a minimal increase in the overall pressure of the growth chamber is realized. Subsequently, all remaining valves 143, 144, and 145 are then opened in sequence, progressing from the injector side 131 towards the regulator 154.

A plasma is generated by Radio Frequency (RF) power supplied from an RF power source (not shown) and a tuning network (140). Further, the MFC 148 is set to a large value (e.g., 0.6 sccm (standard cubic centimeter per minute)) that consequently increases the background pressure in the growth chamber to approximately 1 E-5 Torr over a 240 second duration. During this pressure increase, light emission from the plasma is monitored. When the plasma is observed as emitting visible light, the MFC 148 setting is then reduced to a value setting that is well known to produce a stable growth reactor pressure (e.g., $3 \times 10^{-6}$). Stable is defined herein as not varying over time by more than a few percent. It should be appreciated that if the plasma unit is not designed with an automated matching network 140, manual tuning must be done during the above mentioned dynamic sequence. The MBE system pressure and the plasma source 131 and 140 are stabilized over a pre-determined time interval. For example, a 40 min time period has been utilized; however, the time may vary and is not limited to the time interval disclosed herein. Once stability of the MBE system has been achieved, the sample is turned towards the direction of molecular beams (not shown) and the respective element shutters (not shown) for the elements Ga, As, and N to be included. Chiller 110 and water drain line 135 are responsible for providing cooling water to the plasma source 131 and tuning network 140 during growth. The element shutters (not shown) are immediately opened and the shutters generally remain opened until a film of sufficient or desired thickness has been deposited. At this point the N shutter is closed, the RF power is turned off, and the gas valve 137 is closed.

A thin cap-layer of GaAs may then be deposited on top of the nitrogen-containing film. Once completed, the remaining element shutters are closed and the sample temperature is decreased to room temperature. The sample is then formed and can be extracted from the growth reactor.

During the above-mentioned process, the substrate temperature is preferably monitored and controlled using a noncontact, optical technique. Without limitation, band edge monitoring (GaAs) and pyrometry (GaSb) may be utilized here.

FIG. 2 is an illustration of an x-ray diffraction rocking curve utilized for verifying the successful incorporation of Nitrogen. Referring to FIG. 2, the main peak at zero is a representation of the substrate and the smaller peak at ~2100 arc sec is a representation of the film. The heavier topmost curve represents the experimental data recorded from the film grown in the MBE system disclosed herein. Further, the lighter curve represents the theoretical data based upon the projected performance. Specifically, the heavier uppermost curve is an x-ray diffraction rocking curve recorded from GaAsN grown with the isotope $^{15}$N. Further, the lighter, lowermost curve is the recorded data using RADS commercial software obtained from Bede. The various smaller peaks in between are called pendelloesung fringes whose presence indicate flatness of the film. The frequency of these fringes is known to be used to determine the thickness of the layer. The overall excellent agreement between the experimental curve and theoretically predicted curves is evidence of a very high-quality sample. That is, the in-phase characteristics of the two curves are evidence that the MBE system fitted with $^{15}$N-gas capability produces a good quality sample.

Next the sample can be analyzed using resonant nuclear reaction analysis to confirm the incorporation of $^{15}$N in the grown film. FIG. 3 is an illustration of the presence of $^{15}$N in GaAsN measured by resonant nuclear reaction analysis (RNRA). In the preferred embodiment the material grown with $^{15}$N will be analyzed using the reaction:

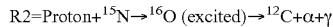

Where O is oxygen, C represents carbon, α represents an emitted alpha particle, and γ represents and emitted gamma ray photon. R2 is a resonant reaction, meaning that it will take place at a much higher rate when the energy of the incoming proton has a specific "resonant" energy. As the proton travels though the substrate material it will lose energy at a specific rate that is determined by the composition and density of the host material. By knowing this rate, and by varying the energy of the protons, the depth at which the resonant reaction takes place can be varied, effectively sampling the presence of the $^{15}$N target nuclei at various depths below the surface.

Reaction R2 of films grown with $^{15}$N can be used for simple depth profiling, or, given a sufficiently high reaction rate, in a "channeling" mode. In ion beam channeling, the primary crystal axes of the sample are tilted in and out of alignment with the incident ion beam, and the change in nuclear reaction yield can be used to elucidate the lattice position of the target nuclei, i.e., nitrogen, within the semiconductor crystal.

An additional effect of reaction R2 in $^{15}$N containing films is that some nitrogen is converted to carbon. When carbon is located on a Group V site it will act as an acceptor. Consequently, inactive nitrogen is transformed into an active dopant center, via a process called "transmutation doping". Conversely, if the film being analyzed exhibits an unwanted n-type dopant concentration, which is frequently the case with dilute-nitride layers, reaction R2 can be used to convert some nitrogen to acceptors, thus reducing the net donor concentration. In the wide-bandgap nitrides p-doping is usually very difficult to accomplish with conventional means such as introduction of gaseous forms of dopant elements during the crystal synthesis or post synthesis ion implantation. Thus, by growing, for example, GaN with $^{15}$N, reaction R2 can be used to create p-dopants at selective depths.

FIG. 3, the left graph illustrates the presence of gamma rays (i.e., photons) at 4.43 MeV, indicating that the reaction R2 has taken place. Returning to FIG. 3, a proton beam with an energy just above the resonant energy (e.g., 897 keV) is directed at the sample and emitted high-energy photons are recorded. By comparing the spectrum of photons (the lighter textured line) emitted to a background (the darker flat line), i.e., having no sample, the characteristic 4.43 MeV gamma from the reaction is identified and measured, confirming the presence of $^{15}$N in the GaAsN film.

As will be appreciated by one skilled in the art, the embodiments described herein may be embodied as a method, a testing process, an apparatus, or a device by which dilute-nitride films can be grown with regular $^{14}$N or with the isotope $^{15}$N. Furthermore, the above cited examples exemplify "solid-source" MBE growth of III-V compound semiconductors. However, it is to be appreciated that other compound semiconductors that include nitrogen can be grown in a similar manner and alternate elements may be delivered via other means other than solid source evaporation, including but not limited to, tri-methyl gas sources.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for analyzing crystal growth in a group III-V semiconductor comprising:
    growing on a group III-V substrate comprising a compound selected from the group of GaAs, GaP, InAs, InSb and InP;
    depositing a group III-V buffer layer comprising one of said compounds on said substrate;
    heating said substrate to a temperature from about 580° C. to 650° C. and then lowering the temperature to about 400-500° C.;
    growing a compound semiconductor thin film layer comprising a combination of group III elements (Ga, In, Al) and group V elements (As, Sb, P) while also incorporating $^{15}$N by injecting a nitrogen gas via a nitrogen gas injector having a concentration of enriched nitrogen gas with a concentration of $^{15}$N greater than naturally occurring nitrogen, wherein said injector further includes an RF power source to create a plasma containing single nitrogen atoms; and
    analyzing the concentration of said nitrogen in said film layer by applying a proton beam to said layer and recording the intensity of the emitted gamma rays to confirm the incorporation of said nitrogen via the reaction:

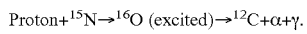

2. The method of claim 1, wherein said thin film layer comprises any one of GaAsN, InAsN, GaSbN, GaAs$^{15}$N, InAs$^{15}$N, and GaSb$^{15}$N.

3. The method of claim 1 further including:

forming a cap-layer on said thin film layer comprising any one of GaAs and GASb compounds.

4. The method of claim 1, wherein said confirming the incorporation of said nitrogen further comprises:

converting a concentration of nitrogen atoms to acceptors, namely carbon atoms.

5. The method of claim 1, wherein the concentration of enriched $^{15}$N nitrogen gas has a concentration of greater than about 95 percent $^{15}$N.

6. The method of claim 5, wherein the concentration of enriched $^{15}$N nitrogen gas has a concentration of greater than about 98 percent $^{15}$N.

7. The method of claim 6, wherein the concentration of enriched $^{15}$N nitrogen gas has a concentration of greater than about 99 percent $^{15}$N.

8. The method of claim 7, wherein the concentration of enriched $^{15}$N nitrogen gas has a concentration of greater than about 99.5 percent $^{15}$N.

* * * * *